(12) United States Patent
Kim et al.

(10) Patent No.: US 9,812,333 B2
(45) Date of Patent: Nov. 7, 2017

(54) NANOSCALE PATTERNING METHOD AND INTEGRATED DEVICE FOR ELECTRONIC APPARATUS MANUFACTURED THEREFROM

(71) Applicants: KOREA ADVANCED INSTITUTE OF SCIENCE AND TECHNOLOGY, Daejeon (KR); INSTITUTE FOR BASIC SCIENCE, Daejeon (KR)

(72) Inventors: Sang Ouk Kim, Daejeon (KR); Hyoung-Seok Moon, Daejeon (KR)

(73) Assignees: Korea Advanced Institute of Science and Technology, Daejeon (KR); Institute for Basic Science, Daejeon (KR)

( * ) Notice: Subject to any disclaimer, the term of this patent is extended or adjusted under 35 U.S.C. 154(b) by 113 days.

(21) Appl. No.: 14/583,492

(22) Filed: Dec. 26, 2014

(65) Prior Publication Data

US 2015/0187602 A1     Jul. 2, 2015

(30) Foreign Application Priority Data

Dec. 26, 2013   (KR) .................. 10-2013-0163898

(51) Int. Cl.
| | |
|---|---|
| *H01L 21/308* | (2006.01) |
| *B81C 1/00* | (2006.01) |
| *H01L 21/033* | (2006.01) |
| *H01L 21/311* | (2006.01) |
| *H01L 21/02* | (2006.01) |

(52) U.S. Cl.
CPC ...... *H01L 21/3086* (2013.01); *B81C 1/00031* (2013.01); *H01L 21/0337* (2013.01); *H01L 21/0338* (2013.01); *H01L 21/31144* (2013.01); *B81C 2201/0149* (2013.01); *H01L 21/02178* (2013.01); *Y10T 428/24802* (2015.01)

(58) Field of Classification Search
None
See application file for complete search history.

(56) References Cited

U.S. PATENT DOCUMENTS

2008/0299774 A1* 12/2008 Sandhu ............... H01L 21/0337
                                                      438/696
2011/0300712 A1* 12/2011 Kim .................... H01L 21/0273
                                                      438/703

FOREIGN PATENT DOCUMENTS

| KR | 20100014768 A   | 2/2010  |
| KR | 1020100032397 A | 3/2010  |
| KR | 20120119998 A   | 11/2012 |
| KR | 101291223 B1    | 7/2013  |

* cited by examiner

*Primary Examiner* — Jiong-Ping Lu
(74) *Attorney, Agent, or Firm* — McCoy Russell LLP

(57) ABSTRACT

Provided is a nanoscale patterning method using self-assembly, wherein nanoscale patterns having desirable shapes such as a lamella shape, a cylinder shape, and the like, may be formed by using a self-assembly property of a block copolymer, and low segment interaction caused in a structure of 10 nm or less which is a disadvantage of the block copolymer may be prevented. In addition, even though single photolithography is used, pattern density may double as that of the existing nano patterns, and pitch and cycle of the patterns may be controlled to thereby be largely utilized for electronic apparatuses requiring high integration of circuits such as a semiconductor device, and the like.

8 Claims, 23 Drawing Sheets

Cylinder PS-b-PMMA directed self-assembly and PMMA cylinder etching

Metal oxide spacer layer deposition by ALD

Top spacer layer etching with ICP-RIE

PS templates etching by O₂ RIE for pattern size shrinking

NANOSCALE PATTERNING METHOD AND INTEGRATED DEVICE FOR ELECTRONIC APPARATUS MANUFACTURED THEREFROM

CROSS-REFERENCE TO RELATED APPLICATIONS

This application claims priority under 35 U.S.C. §119 to Korean Patent Application No. 10-2013-0163898, filed on Dec. 26, 2013, in the Korean Intellectual Property Office, the disclosure of which is incorporated herein by reference in its entirety.

TECHNICAL FIELD

The following disclosure relates to a nanoscale patterning method and an integrated device for an electronic apparatus manufactured therefrom, and more particularly, to a nanoscale patterning method capable of forming high density and nanoscale patterns by inducing self-assembly of a block copolymer, forming an inorganic spacer layer, and removing the block copolymer, and an integrated device for an electronic apparatus manufactured therefrom.

BACKGROUND

A memory device is generally provided as an internal semiconductor integrated circuit in a computer or other electronic devices. In the memory device, there are various different kinds of memories including random access memory (RAM), read only memory (ROM), dynamic random access memory (DRAM), synchronous dynamic random access memory (SDRAM) and flash memory. In particular, the flash memory device was developed and has become popular for supplying a non-volatile memory for a wide range of electronic applications. For the flash memory device, high memory density (degree of integration), high reliability, and low power consumption should be generally considered.

A semiconductor chip has been developed in view of degree of integration according to Moore's law since a bipolar transistor was developed at Bell Labs in 1947. This development has been ongoing in accordance with the continuous development of a photoetching process. However, recently, according to the International Technology Roadmap for Semiconductor (ITRS), it is known that a process technology of 30 nm or less has many problems in being implemented due to limitation of the photoetching technology. Accordingly, a technology for fabricating various nanopatterns is being developed based on a new principle, and among these research fields, research into a molecularly assembled nanostructure has received attention around the world.

As described above, in order to increase memory density in the semiconductor devices such as a flash memory, and the like, an attempt to increase degree of integration of the semiconductor device has continued. Area occupied by each unit cell in a plane is decreased, and in accordance with the decrease in unit cell area, a design rule of small nanoscale critical dimension (CD) at several to several tens of nm level has been applied, and thus, the new technology for fabricating fine patterns such as fine contact hole patterns having nanoscale opening size or fine line patterns having a nanoscale width has been demanded.

When formation of fine patterns for manufacturing a semiconductor device depends on only photolithography in a top-down scheme, there is a limitation in improving resolving power due to a wavelength limit of light source and resolution limit of an optical system, and the like. A method of forming a fine structure in a bottom-up scheme using self-assembly phenomenon of molecules was attempted as one effort for overcoming a resolution limit in the photolithography technology and developing the next generation fine processing technology.

The most representative polymer material forming the molecularly assembled nanostructure is a block copolymer (BCP) having a molecular structure in which chemically different domain blocks are covalently linked to each other. As a result, the block copolymer may form various nanostructures such as sphere, cylinder, lamella, and the like, having several to several tens of nano levels of uniformity, and have advantages of thermal stability, and an ability to design size and physical properties of the nanostructure in a synthesis step. In addition, the nanostructure may be rapidly implemented in a large area by a parallel process, and after forming inorganic and organic nanostructure thin films, a block copolymer template is easily removed, such that intensive research as a technology for fabricating nanopatterns for manufacturing various second generation devices such as a nanowire, quantum dots, magnetic storage medium, non-volatile memory, and the like, in IT, BT, and ET fields has been conducted.

Among them, polystyrene-block-polymethylmethacrylate (PS-B-PMMA) may be easily synthesized, and may form a vertical lamella or a cylinder nano structure at a high ratio through vacuum annealing which is easily capable of being implemented at fabrication facility. Further, pattern transcription after performing selective etching of PMMA nanodomain is easily performed. Nevertheless, in PS-b-PMMA having significantly low $\chi$ (segment interaction) value, patterns of 12 nm or less may not be formed, which is a problem in 10 nm scale pattern currently required in a semiconductor industry.

RELATED ART DOCUMENT (Patent Document 1) Korean Patent No. KR 10-1291223 (Jul. 24, 2013)
(Patent Document 2) Korean Patent Laid-Open Publication No. KR 10-2010-0014768 (Feb. 11, 2010)
(Patent Document 3) Korean Patent Laid-Open Publication No. KR 10-2012-0119998 (Nov. 1, 2012)

SUMMARY

An embodiment of the present invention is directed to providing a nanoscale patterning method capable of forming high density and nanoscale patterns by inducing self-assembly of a block copolymer, forming an inorganic spacer layer, and removing the block copolymer.

Another embodiment of the present invention is directed to providing an integrated device for an electronic apparatus including a substrate etched by using patterns formed from the nanoscale patterning method as an etching mask, wherein the integrated device for an electronic apparatus includes silicon line patterns having high density as compared to the existing nanopatterns, and having a fine scale of 20 nm or less.

In one general aspect, there is provided a nanoscale patterning method using self-assembly, including: a) a step of forming photoresist patterns on a substrate by using lithography; b) a step of forming a block copolymer thin film including two or more kinds of domain blocks on the substrate including the photoresist patterns formed thereon; c) a step of selectively removing any one domain block from the block copolymer thin film; d) a step of forming an inorganic spacer layer on a surface of the block copolymer thin film of the step c); and e) a step of removing the remaining block copolymer thin film of the step d).

The step b) may include: b1) a step of forming the block copolymer thin film on a region exposed through the photoresist patterns; and b2) a step of forming a self-assembled nanostructure in the region exposed through the photoresist patterns by annealing the block copolymer thin film.

The step e) may include: e1) a step of removing a portion parallel to a first direction from the inorganic spacer layer; and e2) a step of removing the remaining block copolymer thin film.

The nanoscale patterning method may further include: after the step e), f) a step of etching a surface of the substrate of the step e), using the inorganic spacer layer as an etching mask.

The step d) of forming the inorganic spacer layer may be performed by any one or two or more methods selected from the group consisting of resistance heating vapor deposition, electron beam heating vapor deposition, high-frequency heating vapor deposition, laser beam heating vapor deposition, direct current (DC) sputtering, radio frequency (RF) sputtering, ion plating, epitaxial, atmospheric pressure CVD, low pressure CVD, plasma CVD, photo CVD and atomic layer deposition (ALD).

The photoresist may include any one or two or more polymer resins selected from the group consisting of novolac polymer, polyvinyl phenol, acrylate, norbornene polymer, polytetrafluoroethylene, silsesquioxane polymer, polymethylmethacrylate, terpolymer, poly-1-butene sulfone, novolak-based positive electron resist, poly(methyl-α-chloroacrylate-co-α-methyl styrene), poly(glycidyl methacrylate-co-ethyl acrylate) and polychloromethylstyrene.

The lithography may be any one or two or more selected from the group consisting of photolithography, soft lithography, nanoimprint lithography, and scanning probe lithography.

The block copolymer may be any one or two or more selected from the group consisting of polystyrene-block-polymethylmethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene.

In another general aspect, there is provided an integrated device for an electronic apparatus including a substrate partially etched by using nanoscale patterns as an etching mask, wherein a silicon line pattern on the substrate has a pitch length of 1 to 20 nm, and a pitch cycle of 1 to 30 nm. Here, the silicon line pattern may have a lamella shape or a cylinder shape, and the silicon line pattern having the cylinder shape may have at least one hollow part formed therein.

The silicon line pattern may be a combination of upper inorganic spacer layer patterns and lower silicon line, and may be formed by any one or two or more nano lithography selected from the group consisting of photolithography, EUV lithography, nanoimprint lithography, and scanning probe lithography.

BRIEF DESCRIPTION OF THE DRAWINGS

FIGS. 3A-F and 4A-F schematically and sequentially show a process of forming nanoscale thin film patterns in cross sections, wherein FIGS. 3A and 4A are pre-patterned substrates which are formed by photoresist using lithography, FIGS. 3B and 4B are patterned substrates which are formed by selectively removing any one domain block of block copolymers on the pre-patterned substrates of FIGS. 3A and 4A, FIGS. 3C and 4C are patterned substrates which are coated by inorganic spacer layer on the patterned substrates of FIGS. 3B and 4B, FIGS. 3D and 4D are patterned substrates which are formed by removing portions parallel to the first direction from the inorganic spacer layer of FIGS. 3C and 4C, FIGS. 3E and 4E are patterned substrates which are formed by removing the remaining block copolymer thin film from the patterned substrates of FIGS. 3D and 4D, FIGS. 3F and 4F are nanoscale-patterned substrates which are formed by ethcing the lower substrate of FIGS. 3E and 4E.

FIGS. 12A-D shows block copolymer patterns and nanopatterns formed by Examples 7 and 8, wherein FIG. 12A is a SEM photograph showing block copolymer patterns of Example 7, FIG. 12B is a SEM photograph showing block copolymer patterns of Example 8, FIG. 12C is a SEM photograph showing nanopatterns of Example 7, and FIG. 12D is a SEM photograph showing nanopatterns of Example 8.

FIGS. 13A-C shows block copolymer patterns and thin film patterns formed by Example 9, wherein FIG. 13A is a SEM photograph showing patterns after an inorganic spacer layer is formed, FIG. 13B is a SEM photograph showing patterns after the inorganic spacer layer is etched, FIG. 13C is a SEM photograph showing patterns after the remaining block copolymer thin film is removed, in Example 9.

FIG. 14A-B is a SEM photograph showing etched Si substrate formed by Examples 10 and 11, wherein FIG. 14A shows a substrate of Example 10 and FIG. 14B shows a substrate of Example 11.

DETAILED DESCRIPTION OF MAIN ELEMENTS

Figure 1:
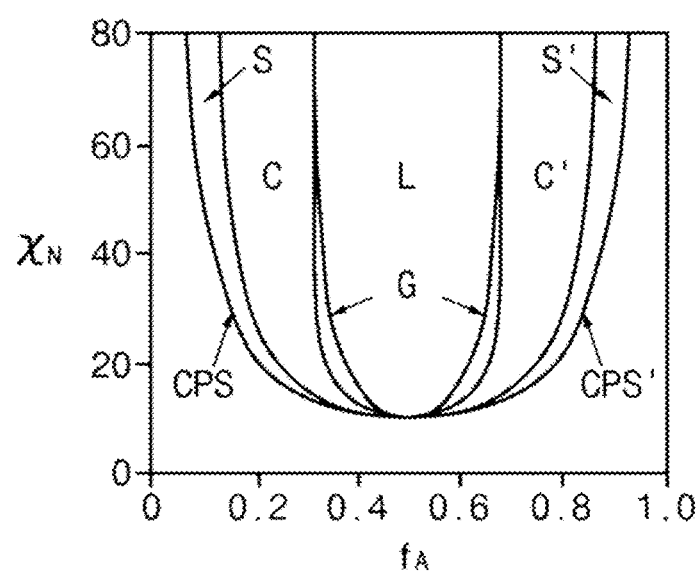
FIG. 1 is a schematic diagram of various nano structures of a block copolymer formed according to composition ratio of a polymer.

100: Nanopatterns Forming Substrate
110: Substrate
120: Photoresist Patterns
121: Removing Part
122: Retaining Part
130: Block Copolymer Thin Film
131: Hydrophilic Domain Block
132: Hydrophobic Domain Block
140: Inorganic Spacer Layer

DETAILED DESCRIPTION OF EMBODIMENTS

Hereinafter a nanoscale patterning method and an integrated device for an electronic apparatus including a substrate partially etched by using nanoscale patterns as an etching mask according to the present invention are described in detail with reference to the accompanying drawings and exemplary embodiments. Meanwhile, the following exemplary embodiments and examples are provided as a reference for explaining the present invention in detail, and therefore, the present invention is not limited thereto, but may be implemented in various ways.

Unless defined otherwise, all technical and scientific terms used herein have the same meanings generally understood by those skilled in the art to which the present invention pertains. Terms used in the specification of the present invention are to effectively describe specific exemplary embodiments, but are not intended to limit the present invention.

In addition, the drawings to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Further, like reference numerals denote like components throughout the specification.

It is intended that singular forms used in the appended specification and claims include plural forms unless otherwise indicated in the context.

Figure 2A:
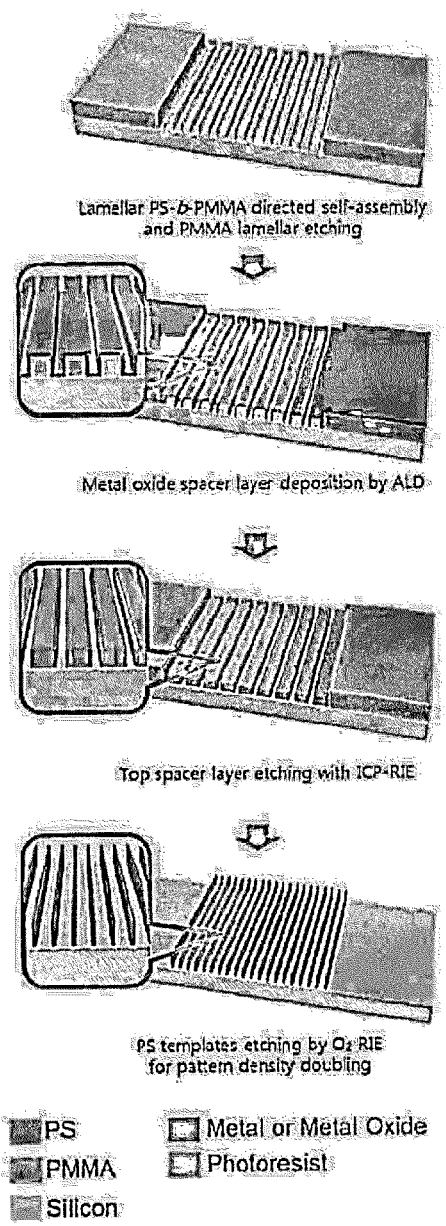
FIGS. 2A-B schematically and sequentially show a process of forming nanoscale thin film patterns, wherein 2A is a lamella shape and 2B is a cylinder shape.
Figure 2B:
Figure 2B:
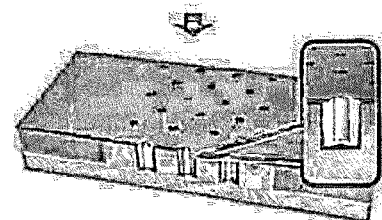
Figure 2B:
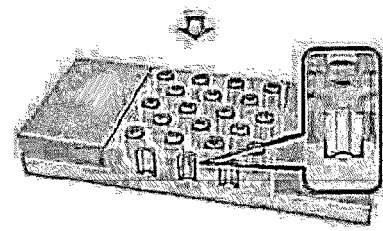
Figure 2B:
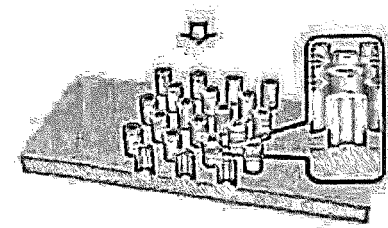
Figure 2B:
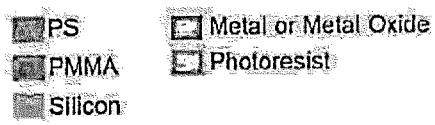

First, when explaining terms "a first direction" and "a second direction" shown in FIGS. 3A-F of the present invention, D1 indicates a direction parallel to a plane on which photoresist and a nanostructure are formed among various planes of a substrate, and a direction parallel to a long direction of the substrate as shown in FIGS. 2A-B. In addition, the second direction indicates a direction vertical to the first direction.

The method of forming nanoscale patterns according to the present invention uses self-assembly phenomenon of a block copolymer, and various nanostructures capable of being formed are firstly described with reference to FIG. 1. Specifically, FIG. 1 is a view showing an expected state of a self-assembled nanostructure of a double block copolymer according to self-consistent mean field theory, wherein an x axis indicates $f_A$, and a y axis indicates $\chi_N$. N (degree of polymerization) indicates a polymer size, and $\chi$ (segment interaction) indicates degree of mutual reaction between two blocks. When A is a first polymer block, and B is a second polymer block in addition to the first polymer including A-block-A, $f_A$ is defined as a relative composition ratio of A. $f_B$ may be defined as a relative composition ratio of B.

In FIG. 1, when $\chi_N < 10$ is satisfied, the block copolymer is disorderedly formed, and when $10 < \chi_N < 100$ and $f_A = N_A/(N_A+N_B) \leq 0.18$ to $0.23$ are satisfied, a spherical nanostructure of a body centered cubic surrounded by B block substrate is formed. In addition, when $f_A \leq 0.30$ to $0.35$ is satisfied, a cylinder nanostructure in which a nanodomain forming the sphere as a hexagonal lattice is formed, and when $f_A$ is increased to satisfy $0.35 \leq f_A \leq 0.40$, a gyroid nanostructure in which two cylinder nanostructures continuously connect to each other is formed. Finally, when $f_A \approx 0.5$ is satisfied, lamella nanostructure is formed.

Regarding this, when $f_B=N_B/(N_A+N_B) \leq 0.18$ to 0.23 is satisfied, a spherical nanostructure of a body centered cubic surrounded by A block substrate is formed. In addition, when $f_B \leq 0.30$ to 0.35 is satisfied, a cylinder nanostructure in which nanodomain forming the sphere is hexagonal lattice is formed, and when $f_B$ is increased to satisfy $0.35 \leq f_B \leq 0.40$, a gyroid nanostructure in which two cylinder nanostructures are continuously connected to each other is formed. Finally, when $f_B \approx 0.5$ is satisfied, lamella nanostructure is formed.

Figure 3A:
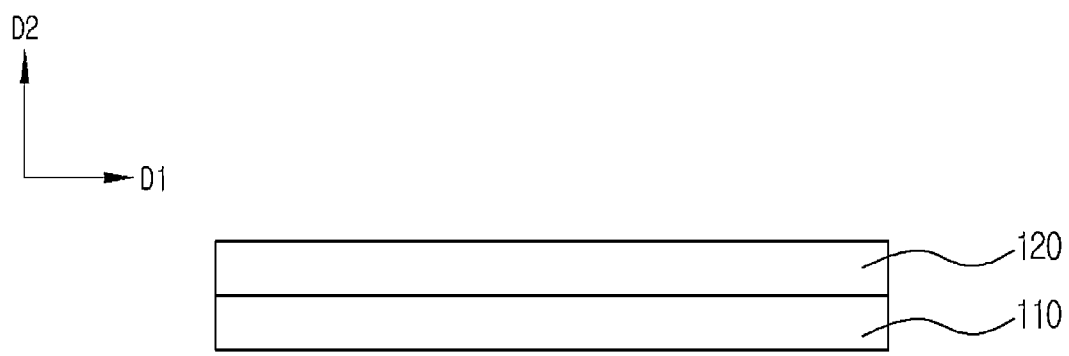
Figure 3B:
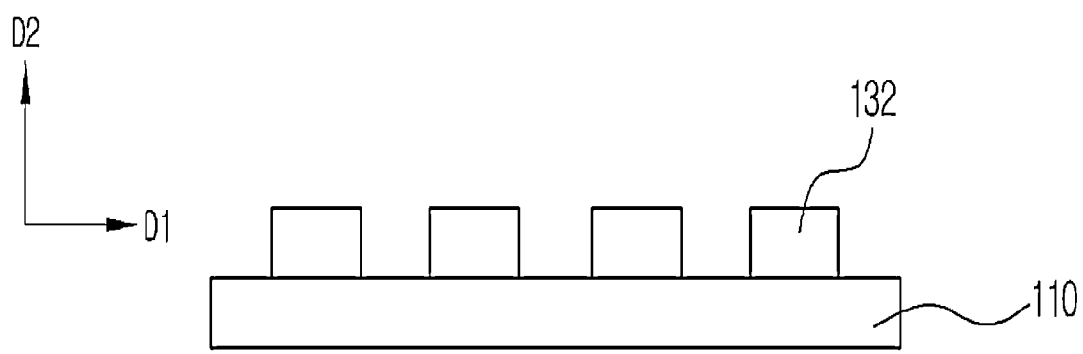
Figure 3C:
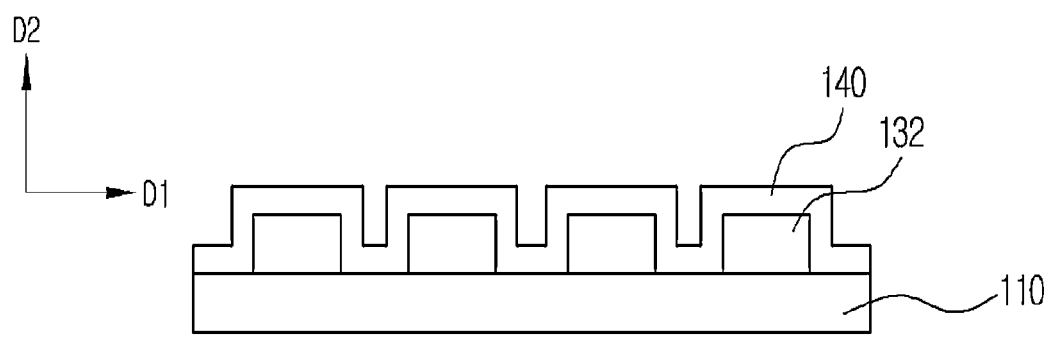
Figure 3D:
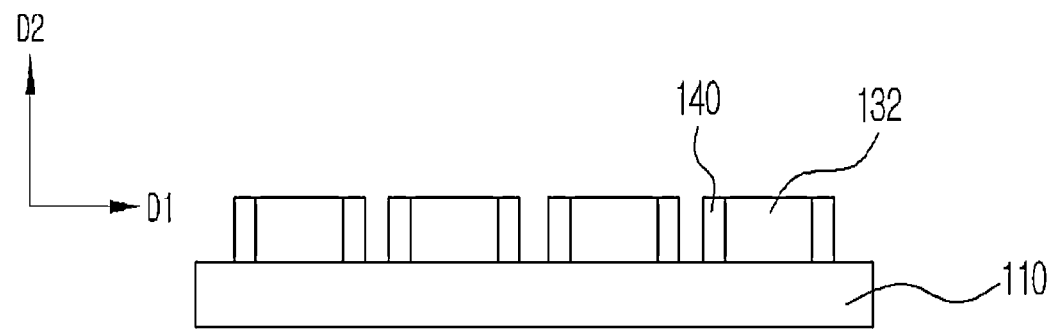
Figure 3E:
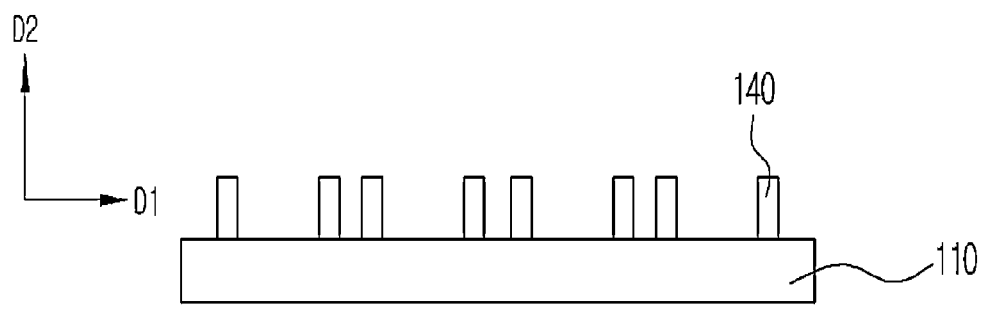
Figure 3F:
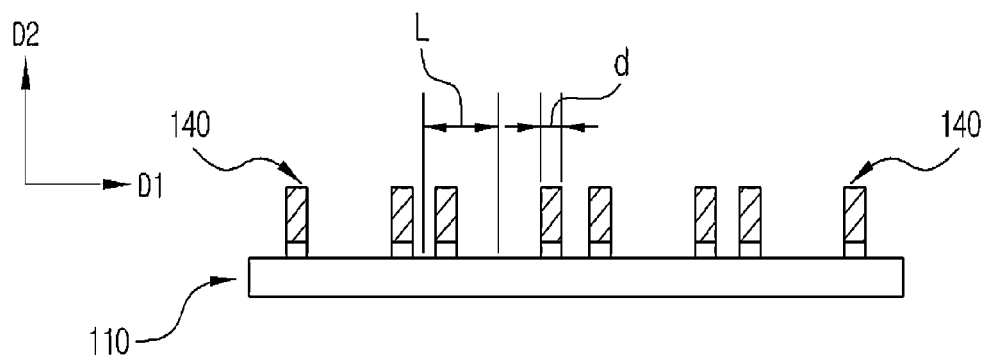
Figure 4A:
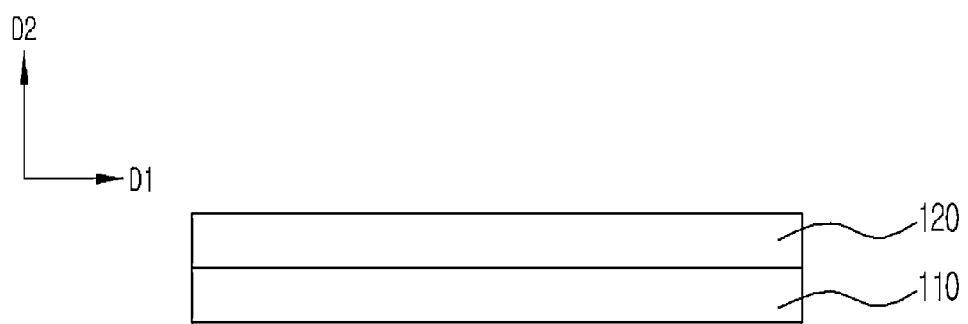

When explaining the method of forming the nanoscale metal patterning using the self-assembly according to the present invention with reference to FIGS. 3A-F and 4A-F, first, a process of forming photoresist patterns on the substrate using lithography is performed as described in step (a). [see FIG. 3A and FIG. 4A]

The substrate 110 may be any kind of substrate as long as it is generally used as a supporter for an electronic device in the art. For example, the substrate may be a semiconductor substrate such as a silicon.

The photoresist patterns 120 according to the present invention serve to determine a position at which a block copolymer thin film is formed, and to stably grow the self-assembled nanostructure to be formed in the block copolymer in a vertical direction (second direction) to the substrate.

The photoresist patterns according to the present invention is not limited but may be mainly fabricated by using organic photoresist. Examples of the organic photoresist include without limitation any one or two or more polymer resins selected from the group consisting of novolac polymer, polyvinyl phenol (PVP), acrylate, norbornene polymer, polytetrafluoroethylene (PTFE), silsesquioxane polymer, polymethylmethacrylate (PMMA), terpolymer, poly(1-butene sulfone) (PBS), novolak-based positive electron resist (NPR), poly(methyl-α-chloroacrylate-co-α-methyl styrene) (ZEP), poly(glycidyl methacrylate-co-ethyl acrylate) (COP) and polychloromethylstyrene (PCMS). In addition, either a positive photoresist or a negative photoresist is possible, but the present invention is not limited thereto.

In the present invention, the lithography may be any one or two or more selected from the group consisting of photolithography, soft lithography, nanoimprint lithography, and scanning probe lithography.

The photolithography is a method in which photoresist is formed on the substrate, an exposing process is performed by deep ultraviolet (DUV) lithography using g-line (436 nm), h-line (405 nm), i-line (365 nm), KrF (248 nm) laser, ArF (193 nm) laser, and 157 nm wavelength as a light source depending on wavelength, PXR (Proximity X-Ray) using X ray, e-beam projection lithography using an electron beam, extreme ultraviolet lithography using extreme ultraviolet of 13.5 nm, and the like, and then a developing process is performed using a developing solution.

Examples of soft lithography include microcontact printing, electrical microcontact printing, and transfer printing. The soft lithography is a method in which an elastomeric (poly(dimethylsiloxane) [elastomeric PDMS] stamp is stained with a suitable alkanethiol solution as an ink so that ink molecules are delivered to a portion stained with alkanethiol.

The nanoimprint is a method in which a polymer layer is formed so as to be flexible by heat and, then is in contact with a template having patterns, and physically pressed, such that desirable patterns are formed on the polymer layer.

Scanning probe lithography is a method of processing patterns by directly applying power to a sample surface using a microprobe (tip) to mechanically change a shape.

In the present invention, organic photoresist is used to form patterns on the substrate, and when the organic photoresist is used, it is easy to remove the organic photoresist after forming the nanostructure of the block copolymer as compared to the existing method of using inorganic photoresist.

Figure 5:
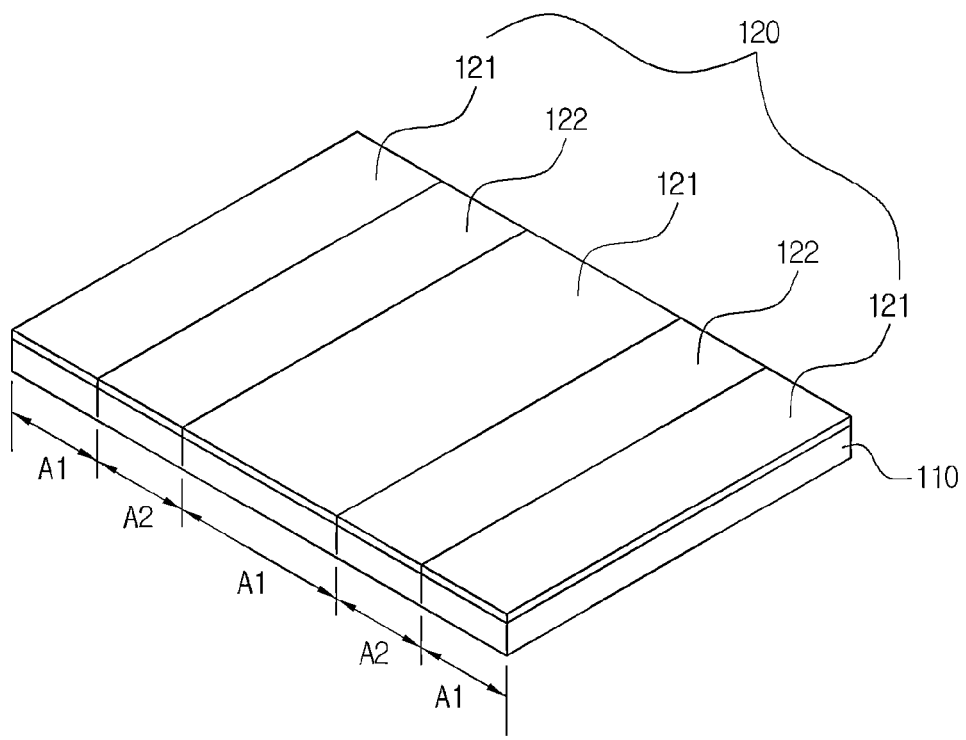
FIG. 5 shows a substrate having a photoresist layer deposited thereon.
Figure 6:
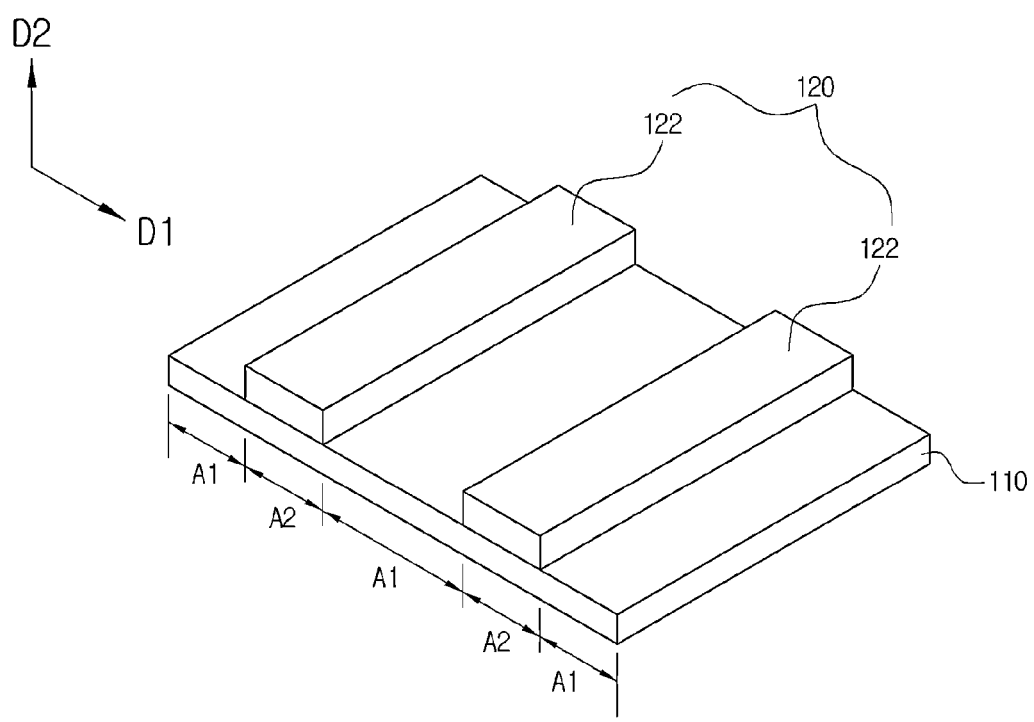
FIG. 6 shows a substrate in which a pattern part is formed in the photoresist layer.
Figure 7:
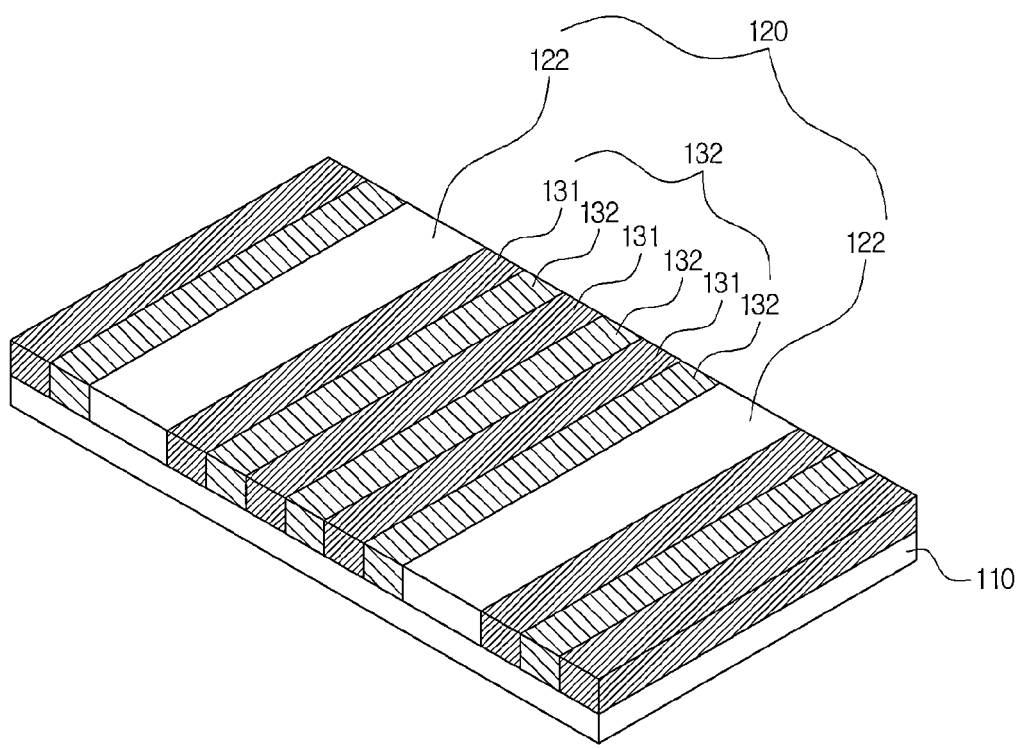
FIG. 7 shows a substrate in which a lamella shaped block copolymer thin film is deposited on the pattern part of the photoresist layer.

When explaining the above description in more detail with reference to FIGS. 5 and 6, the photoresist layer 120 is firstly formed on the surface of the substrate 110. The photoresist layer may be divided into a removing part 121 and a retaining part 122 depending on a pattern shape, and density and interval of the nanopatterns may be controlled by controlling a size of a first region (A1) and a second region (A2) occupied by the removing part and the retaining part, respectively.

FIG. 6 shows a state in which the removing part 121 is removed and the retaining part 122 is only left in the photoresist layer 120, wherein the block copolymer thin film is formed at a position of the removing part, such that patterns may be densely formed.

The organic photoresist patterns formed on the substrate in the present invention is formed by lithography, and may control orientation of the block copolymer by coupling with the nanostructure of the block copolymer induced by annealing. For example, as an aspect ratio of the organic photoresist patterns becomes large, correlation length of the block copolymer is increased, such that an arrangement is easily conducted, and the process may be appropriately performed even though a thick block copolymer is deposited. In the present invention, in order to control orientation of the nanostructure of the block copolymer, the organic photoresist pattern preferably has a thickness of 100 nm to 1 μm, and an interval between the organic photoresist patterns of 1 nm to 900 nm. Meanwhile, in the above-mentioned range, the patterns have excellent degree of arrangement of the block copolymer, and when it is out of the above range, even though it is possible to control orientation of the block copolymer, the degree of arrangement may be deteriorated.

The organic photoresist used in the lithography process of the present invention is determined by a light source used in the lithography process. That is, when the light source is g-line (436 nm), h-line (405 nm) and i-line (365 nm), a novolac polymer is used as the organic photoresist, when the light source is KrF (248 nm) laser, polyvinylphenol is used as the organic photoresist, when the light source is ArF (193 nm) laser, acrylate or Norbornene polymer is used as the organic photoresist, and when the light source is deep ultraviolet (DUV) or F2 excimer laser (157), polytetrafluoroethylene (PTFE) or silsesquioxane polymer is used as the organic photoresist. In addition, when the light source is an electron beam, an X-ray, an extreme UV (13.4 nm) or an ion beam, polymer such as poly methylmethacrylate (PMMA), terpolymer, poly(1-butene sulfone) (PBS), novolac based positive electron resist (NPR), poly(methyl-α-chloroacrylate-co-α-methyl styrene) (ZEP), poly(glycidyl methacrylate-co-ethyl acrylate) (COP), polychloromethylstyrene (PCMS), or the like is preferably used.

After the photoresist patterns are formed, the block copolymer thin film including two or more kinds of domain blocks may be formed on the substrate including the photoresist patterns formed thereon as shown in step (b). More specifically, step b) may include: b1) forming the block copolymer thin film on a region exposed through the photoresist patterns; and b2) forming a self-assembled nanostructure in the region exposed through the photoresist patterns by annealing the block copolymer thin film.

The block copolymer according to the present invention generally refers to a functional polymer in which two or more kinds of domain blocks having different structure or properties are covalently linked to each other as one polymer, wherein the domain blocks configuring the block copolymer have different physical properties and selective solubility, respectively, due to the difference of each chemical structure. This is the reason that the block copolymer forms a self-assembled structure by phase separation or selective dissolution in solution phase or solid phase. Formation of the fine structure having a specific shape by self-assembly of the block copolymer is influenced by physical/chemical properties of the domain blocks. For example, when diblock copolymer configuring two different structures is self-assembled on a bulk substrate, volume fraction between each domain block configuring the block copolymer is primarily influenced by molecular weight of each domain block. The self-assembled structure of the block copolymer has any one structure determined among various structures such as three-dimensional cubic and double gyroid, two-dimensional hexagonal packed column, and lamellar structure, depending on volume fraction between two domain blocks. Here, a size of each domain block in each structure is proportional to molecular weight of a corresponding domain block.

The block copolymer according to the present invention may be obtained by polymerizing at least one hydrophilic domain block and at least one hydrophobic domain block. Here, when it is assumed that a molecular weight of the entire block copolymer is 100, a molecular weight ratio of each domain block is preferably 20 to 80 (hydrophilic domain block):80 to 20 (hydrophobic domain block).

For example, when the molecular weight ratio of each domain block is 50:50, a plate shaped (lamella shaped) nanostructure having a patterned structure may be formed, and when the molecular weight ratio of each domain block is 70:30, a cylinder shape nanostructure having the patterned structure may be formed. In addition, gyroid shape nanostructure or spherical nanostructure may be formed depending on composition ratio, but the present invention is not limited thereto.

Examples of the block copolymer according to the present invention may include any one or two or more selected from the group consisting of polystyrene-block-polymethylmethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene, but the present invention is not limited thereto. In addition thereto, any block copolymer capable of forming the structure according to the self-assembly may be used.

As described above, the block copolymer according to the present invention may form the block copolymer thin film on a region exposed through the photoresist patterns. Here, in order that the substrate has a surface neutral to the block copolymer, any one method selected from the group consisting of self-assembled monolayer (SAM), polymer brush, and cross-linked random copolymer mat (MAT), may be used to form the block copolymer thin film. Preferably, brush treatment is preferably used, but the present invention is not limited thereto. The brush treatment is surface modification for producing lamella phase or cylinder phase nanodomain on the surface of the substrate so as to be vertical to the surface by balancing surface tension of the hydrophobic domain block and the hydrophilic domain block. In addition, when the molecular assembled nanostructure of the block copolymer is naturally formed, arrangement may be nonuniform, and many defects may occur. However, according to the present invention, desirable shapes of the nanodomain may be oriented by minimizing the defects.

The substrate on which the block copolymer thin film is formed may be subjected to annealing to form the self-assembled nanostructure in the region exposed through the photoresist patterns. The annealing method may include thermal annealing, solution annealing, and combinations thereof, and annealing conditions may be freely changed by the kinds of domain blocks configuring the block copolymer; however, it is preferable to perform the annealing method at 100 to 500° C. for 10 to 100 hours. The block copolymer may be arranged and assembled by annealing, into various shapes depending on the composition ratio of each domain block.

Figure 4B:
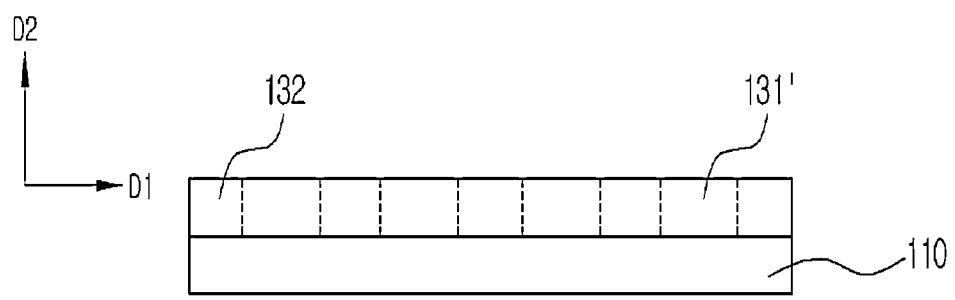

Any one domain block may be selectively removed from the substrate on which the block copolymer thin film is formed as described in step c) [see FIG. 3B and FIG. 4B]. Selective removal of the domain block is to form nano-sized trench having vertical orientation. In the present invention, the removing method is not limited, but at least any one method of dry etching or wet etching may be used. In the wet etching, acetic acid may be used, and in the dry etching, the domain block may be removed by reactive ion etch (RIE). Meanwhile, in the case of the lamella shape structure, other domain block structures other than the removal target may be disintegrated depending on the polymer due to capillary force of the acetic acid liquid, and roughness factor of the patterns is largely increased, such that transcription of desirable patterns may not be achieved. In addition, in removing the domain block through RIE, there is a difference in removing speed depending on the presence of carbon or oxygen in the polymer, such that it is important to determine etching time and intensity in consideration with the difference.

Figure 8:
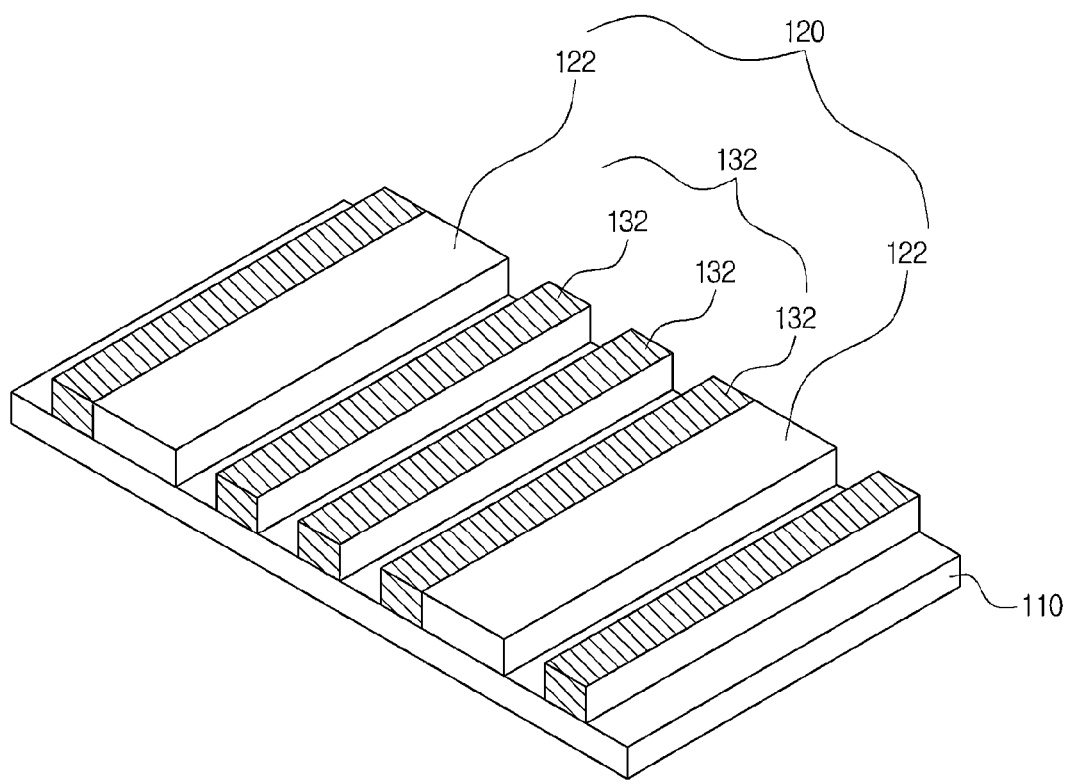
FIG. 8 shows a substrate in which a portion of domain blocks is removed from the block copolymer thin film of FIG. 7.
Figure 9:
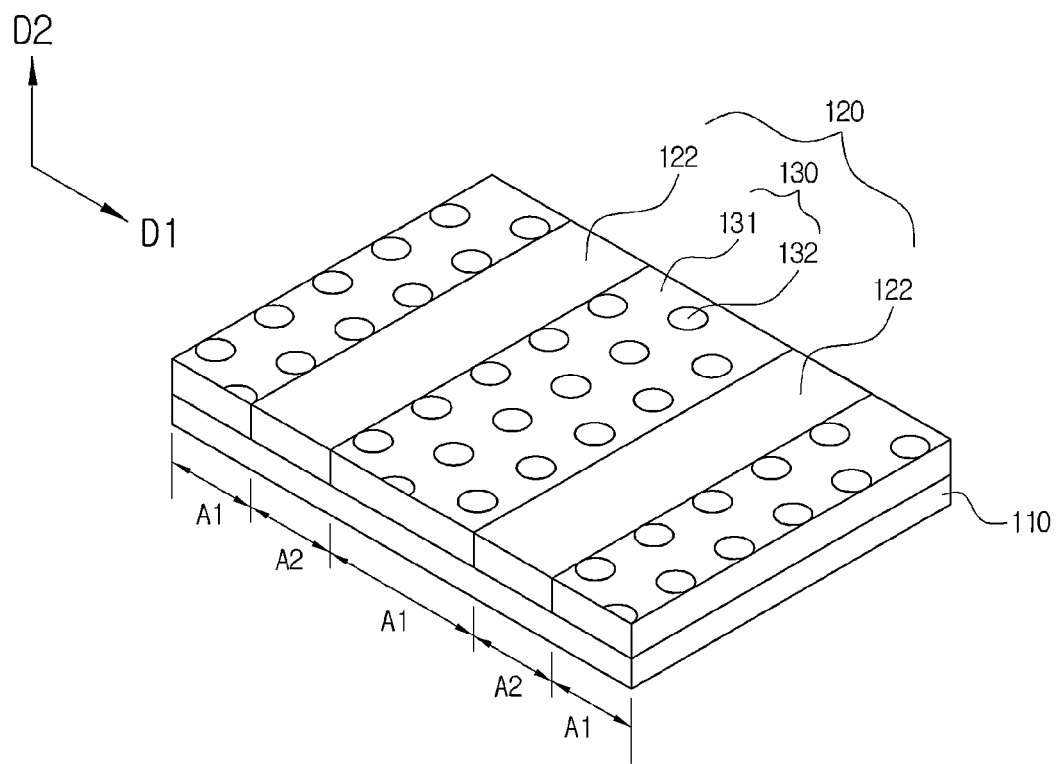
FIG. 9 shows a substrate in which a cylinder shaped block copolymer thin film is deposited on the pattern part of the photoresist layer.
Figure 10:
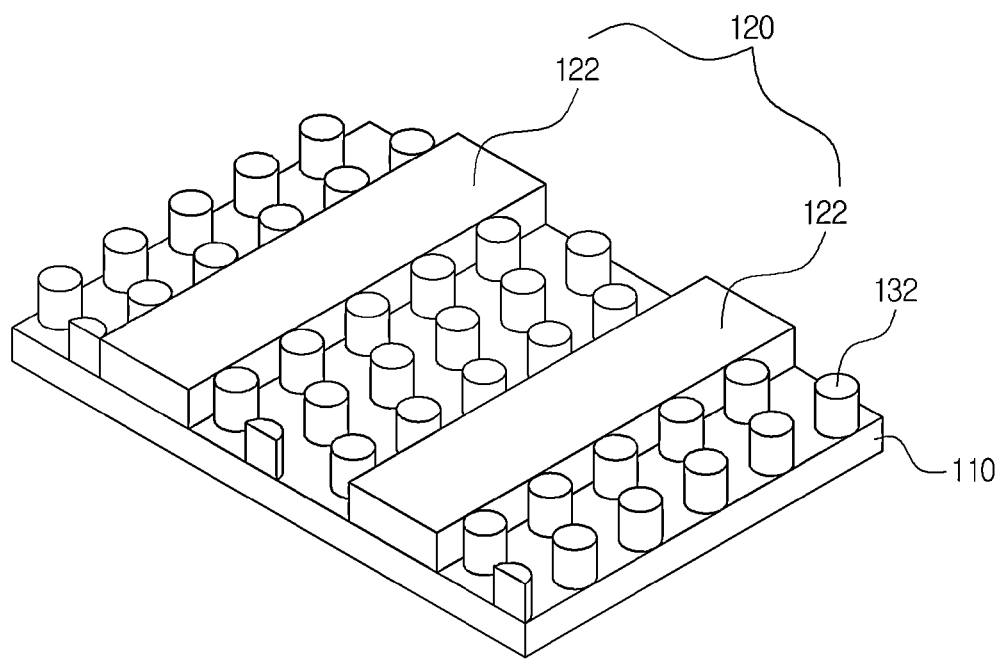
FIG. 10 shows a substrate in which a portion of domain block is removed from the block copolymer thin film of FIG. 9.

In specifically describing the above-description with reference to FIGS. 7 to 10, the block copolymer thin film 130 is deposited to the trench formed between the retaining part 122, followed by annealing to induce self-assembly, such that the block copolymer thin film 130 may include at least one hydrophilic domain block 131 and at least one hydrophobic domain block 132. In addition, when the hydrophilic domain block 131 is removed as shown in FIG. 8 or 10, the hydrophobic domain block 132 may be only left to form more precise patterns. In drawings of the present invention, the lamella shape (FIGS. 7 and 8) and cylinder shape (FIGS. 9 and 10) are only shown; however, various shapes may be implemented by controlling the molecular weight ratio, and the like, of the domain block configuring the block copolymer as described above, and the present invention is not limited to the drawings.

Figure 4C:
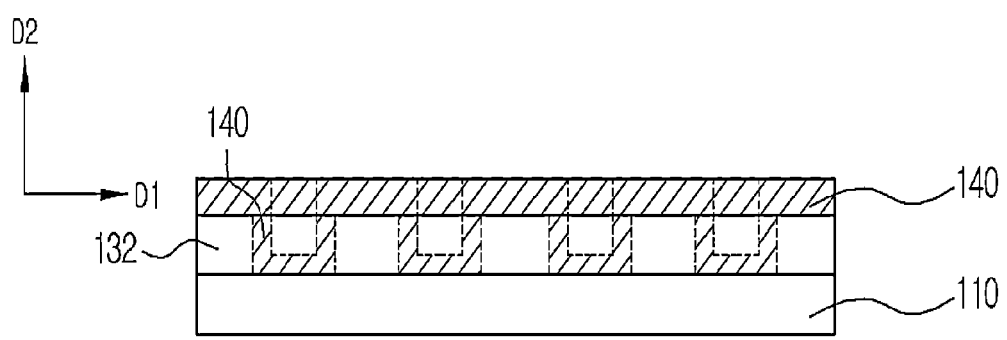
Figure 4D:
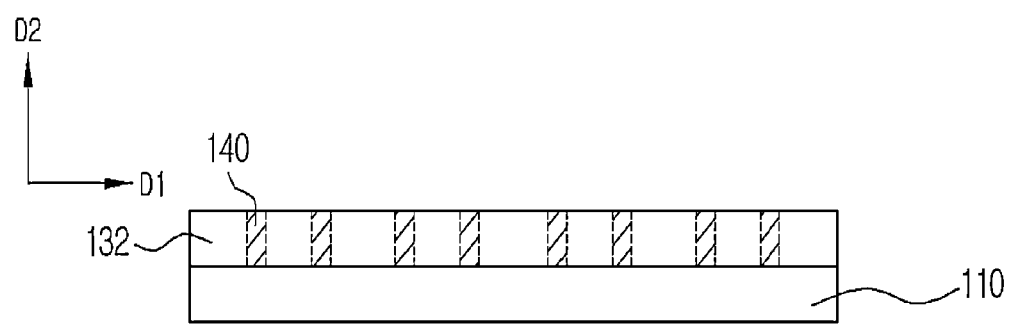

As described above, after any one domain block is selectively removed from the block copolymer thin film, an inorganic spacer layer may be formed on the surface of the block copolymer thin film of step c) [see FIG. 3C and FIG. 4C].

The inorganic spacer layer is a coating layer made of materials including conductive material capable of being etched, for example, metal-containing materials, conductive polymers, metal-containing polymer complexes, and the like, and may include metals such as aluminum, titanium, zinc, tungsten, tantalum, ruthenium, and the like, or oxides of the metal, or materials such as ruthenium tin nitride (RuTinN), and the like. In addition, in order to increase resistance to the etching process in the present invention, inorganic materials including a metal component are described; however, organic materials may be further included as needed, and therefore, the present invention is not limited thereto.

In the present invention, a deposition method of the inorganic spacer layer is not limited; however, may include all of physical vapor deposition (PVD), chemical vapor deposition (CVD), for example, any one or two or more methods selected from the group consisting of vacuum vapor deposition such as resistance heating vapor deposition, electron beam heating vapor deposition, high-frequency heating vapor deposition, laser beam heating vapor deposition, and the like; sputtering such as direct current (DC) sputtering, radio frequency (RF) sputtering, bias sputtering, and the like; ion plating, epitaxial, atmospheric pressure CVD, low pressure CVD, plasma CVD, photo CVD, and atomic layer deposition (ALD). Among them, the ALD method in which low temperature vapor deposition is easily performed regardless of the component of the inorganic spacer layer in various structures is most preferably used.

Deposition conditions of the inorganic spacer layer in the present invention are not limited, and may be freely controlled within the range at which the object of the present invention is capable of being achieved. As an example, the deposition process may be performed at 100 to 300° C., under an inert gas atmosphere for 1 to 600 seconds.

After the inorganic spacer layer is deposited, the remaining block copolymer thin film may be removed as described in step e). Here, step e) may be divided into e1) removing a portion parallel to a first direction from the inorganic spacer layer 140 [see FIG. 3D and FIG. 4D]; and e2) removing the remaining block copolymer thin film 132 [see FIG. 3E and FIG. 4E].

Step e1) is to remove the portion parallel to the first direction (D1) from the inorganic spacer layer 140 as shown in (d) of FIGS. 3A-F and 4A-F, and therefore, two nanopatterns may be formed in one trench, and high density of nanopatterns may be effectively formed as compared to the existing nanopatterning technology.

The removing method of step e1) is not limited in the present invention; however, wet etching or dry etching may be used. For example, all of dry etching such as plasma, reactive ion etching (RIE), inductively coupled plasma (ICP), magnetically enhanced RIE (MERIE), high density plasma, and the like, or wet etching using general acids may be used. Specifically, inductively coupled plasma-reactive ion etching (ICP-RIE) is preferably used because the disadvantages of RIE which is not appropriate for etching the fine structure having a high aspect ratio may be overcome, and directivity of radicals may be increased to achieve anisotropic etching.

Figure 4E:
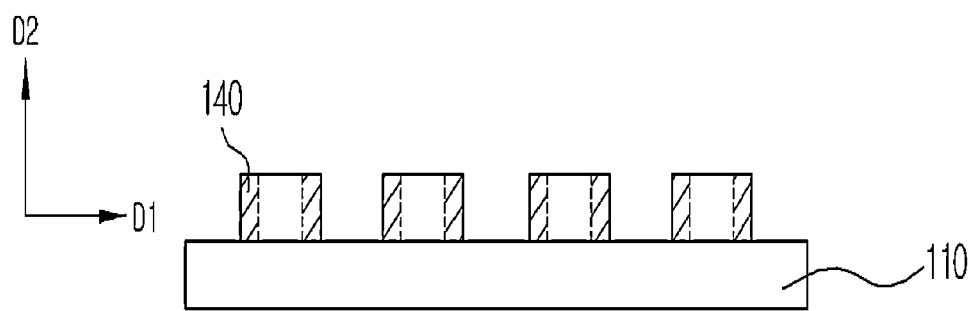

The remaining block copolymer thin film 132 may be removed from the substrate after step e1) is finished, such that high density of metal fine patterns may be completed [see FIG. 3E and FIG. 4E]. The method of removing the block copolymer thin film may be the same as or different from the removing method of the domain block of step c), for example, the block copolymer thin film may be removed by $O_2$-RIE.

Figure 4F:
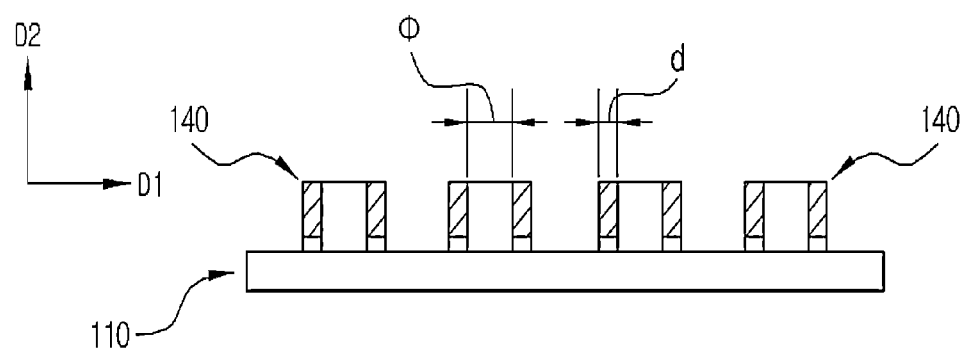

In addition, the method of forming nanopatterns according to the present invention may further include f) a step of etching the lower substrate 100 using the fine nanopatterns fabricated by the method as an etching mask, to transcript the patterns, after step e) [see FIG. 3F and FIG. 4F]. Here, high density nanopatterns may be simply transmitted to the substrate without requiring an additional mask due to high etching resistance of the inorganic spacer layer (140 of FIGS. 3A-F and 4A-F) according to the present invention.

Etching method and etching condition in step f) are not limited in the present invention. For example, the etching process may be performed by photolithography, EUV lithography, nanoimprint lithography, and scanning probe lithography. In addition, the etching condition may be freely changed depending on raw materials forming the inorganic spacer layer, materials of substrate, thickness of substrate, and shapes and sizes of nanopatterns; however, the present invention is not limited thereto.

In specifically describing step f) with reference to FIGS. 3A-F and 4A-F, when the substrate is etched by any one nano lithography method as described above using the nanopatterns (non-etched inorganic spacer layer: 140) formed by step e) as a mask, the nanopatterns having high etching resistance are not etched but remain as they are, and the substrate having etching resistance relatively decreased than that of the nanopatterns is etched by lithography. As a result, the nanopatterns are transmitted to a portion in which the nanopatterns are not formed on the surface of the substrate.

When the patterns formed by step f) are silicon line patterns, the silicon line patterns may be a combination of upper inorganic spacer layer and lower silicon line based on the center part of the patterns.

The present invention provides an integrated device for an electronic apparatus including a substrate partially etched by using the nanoscale patterns formed by the method according to the present invention as an etching mask, The integrated device for an electronic apparatus includes nano-sized devices for medical, electronics/information, optical, sensor, and the like. For example, the integrated device for an electronic apparatus may be applied to materials for medical and optical fields such as light splitting, optical filter, photonic crystal, and the like, and may be used for channel array devices such as a field effect transistor, an NAND flash memory device, and the like.

The integrated device for an electronic apparatus according to the present invention may have the silicon line patterns as described above. Here, the silicon line pattern may have a pitch length (d) of 1 to 20 nm, and a pitch cycle (L) of 1 to 30 nm in FIGS. 3A-F. Meanwhile, the pitch length (d) of the silicon line pattern may be changed depending on the deposition thickness of the inorganic spacer layer, and the pitch cycle (L) may be determined by molecular weight of the block copolymer.

In addition, in FIGS. 4A-F, the pitch length (d) of the silicon line pattern may be the same as described above, and hollow part formed on the silicon line pattern having the cylinder shape may have a diameter ($\phi$) of 1 to 10 nm. Meanwhile, the diameter size of the hollow part and the number of hollow parts may be determined by molecular weight of the block copolymer, but the present invention is not limited thereto.

In addition, the silicon line pattern in the integrated device for an electronic apparatus according to the present invention may have a lamella shape or a cylinder shape. Further, the silicon line pattern having the cylinder shape may have at least one hollow part formed therein. Here, the size of the hollow part is not limited, but may be a diameter of 1 to 10 nm.

In addition, the silicon line pattern may be a combination of the upper inorganic spacer layer patterns and the lower silicon line as shown by FIG. 3F and FIG. 4F. Here, the silicon line pattern may be formed by any one or two or more nano lithography selected from the group consisting of photolithography, EUV lithography, nanoimprint lithography, and scanning probe lithography.

Hereinafter, the nanoscale metal patterning method according to the present invention will be described in detail with reference to the following Examples.

Examples 1 to 6

Figure 11:
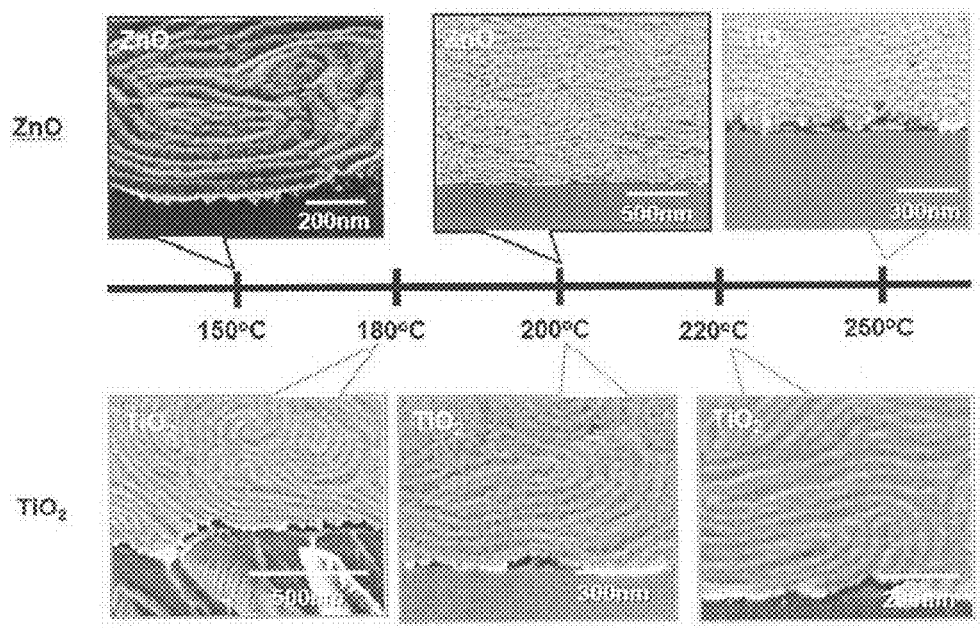
FIG. 11 is a scanning electron microscope (SEM) photograph showing thin film patterns deposited by Examples 1 to 6.

The inorganic spacer layer was formed on the substrate on which the block copolymer thin film etched by the following sequence is formed, and change in deposition shape depending on the change in the deposition conditions of the inorganic spacer layer were measured and shown in FIG. 11.

1. Pre-Treatment of Substrate and Formation of Photoresist Layer

First, a glass substrate (or $Si/SiO_2$, 1 cm×1 cm) was immersed in a piranha solution obtained by mixing sulfuric acid (95 to 97%, Merck) and hydrogen peroxide (30%, Junsei) at a ratio of 7:3, at 110° C. for 1 hour, and washed with desalted water. Then, negative tone photoresist (SU-8, MicroChem Corp., US) having a thickness of 100 nm was deposited on the substrate by spin casting, followed by heating at 95° C. for 60 seconds to remove remaining solvent, thereby increasing density of the photoresist layer.

2. Formation of Photoresist Patterns

After the heating process was completed, the substrate was exposed at 110° C. for 95 seconds by I-line photolithography (Midas/MDA-6000 DUV, KR; wavelength 365 nm, intensity 9.5 $cm^2$) to form patterns. Then, the substrate was immersed in propylene glycol methyl ether acetate solution for 60 seconds to develop the pattern of 1 μm.

3. Formation of Block Copolymer Thin Film and Patterns

A polystyrene-block-polymethylmethacrylate thin film consisting of polystyrene (PS) having weight average molecular weight of 48 kg/mol and polymethylmethacrylate (PMMA) having weight average molecular weight of 46 kg/mol was deposited within the pattern trench formed by the above-described process 2 so as to have a thickness of 100 nm, by spin casting, followed by annealing at 280° C. for 3 hours. After annealing was completed, the block copolymer thin film was irradiated by 6 J energy with UV lamp (λ: 255 nm) for selective cross linkage of PS. Then, RIE ($O_2$ reactive ion etching) was performed under conditions of oxygen supply amount of 40 sccm, RF source power of 100 W and chamber pressure of 60 mTorr to completely remove the PMMA component.

4. Formation of Inorganic Spacer Layer

In order to form the inorganic spacer layer, deposition processes were performed by changing metal precursor, treatment temperature, and precursor heating temperature as shown in the following Table 1. Here, each precursor was heated to the heating temperatures shown in the following Table 1 so as to obtain a predetermined equilibrium vapor pressure. In addition, water ($H_2O$) as a reactive gas and nitrogen ($N_2$) as a carrier gas were injected into a chamber using a switching valve. The metal precursor was injected and purged, then water was injected and purged. Injection flow rate of the carrier gas was 50 sccm, and process pressure was 1 torr.

|  | Example 1 | Example 2 | Example 3 | Example 4 | Example 5 | Example 6 |
| --- | --- | --- | --- | --- | --- | --- |
| Precursor | $Zn(C_2H_5)_2$ | $Ti(OC_3H_7)_4$ | $Zn(C_2H_5)_2$ | $Ti(OC_3H_7)_4$ | $Ti(OC_3H_7)_4$ | $Ti(OC_3H_7)_4$ |
| Heating Temperature | 10° C. | 50° C. | 10° C. | 50° C. | 50° C. | 50° C. |
| Vapor Deposition Temperature | 150° C. | 180° C. | 200° C. | 200° C. | 220° C. | 250° C. |

As shown in FIG. 11, it could be appreciated that PS nanotemplate was decomposed at all temperatures except for Example 1 which was deposited at 150° C., and as the deposition temperature was increased, degree of the decomposition also increased. Accordingly, it could be appreciated that optical deposition temperature is 150° C. or less.

Examples 7 and 8

In order to confirm formation of the $Al_2O_3$ inorganic spacer layer and formation of the nanopatterns by etching, the inorganic spacer layers of Examples 7 and 8 were formed by the same conditions as Examples 1 to 6 except for using trimethylaluminum ($Al(CH_3)_3$, heating temperature: 10° C., deposition temperature: 150° C.) as the metal precursor, and changing each weight average molecular weight of polystyrene and polymethylmethacrylate configuring the block copolymer as shown in the following Table 2, and additionally, the inorganic spacer layer and the remaining block copolymer thin film were etched as follows to form aluminum oxide ($Al_2O_3$) nanopatterns. Shapes of the formed patterns were measured by SEM and shown in FIG. 12.

5. Etching of Inorganic Spacer Layer and Remaining Block Copolymer Thin Film

In order to etch the upper spacer of the inorganic spacer layer (plane parallel to the first direction), inductively coupled plasma reactive ion etching (ICP-RIE, Oxford Instruments, Plasmalab System 100) was used, wherein the etching condition was argon (Ar) gas supply flow rate of 20 sccm, RF source power of 1,000 W, RF shuck power of 100 W, and process pressure of 100 mTorr.

After the etching process of the upper spacer was completed, the remaining block copolymer thin film (PS) was removed. Here, RIE was used, and the etching process was performed under the conditions of oxygen supply amount of 40 sccm, RF source power of 100 W, and chamber pressure of 60 mTorr.

Example 9

Aluminum oxide ($Al_2O_3$) nanopatterns were formed by the same conditions as Examples 7 and 8 except that each weight average molecular weight of polystyrene and polymethylmethacrylate configuring the block copolymer was used as shown in the following Table 2, PMMA was removed by acetic acid, and PS was removed by sintering at air atmosphere and at 380° C. Shapes of the formed aluminum oxide ($Al_2O_3$) nanopatterns were measured by SEM and shown in FIG. 12.

TABLE 2

| | Weight Average Molecular Weight (kg/mol) of Polystyrene | Weight Average Molecular Weight (kg/mol) of Polymethylmethacrylate |
|---|---|---|
| Example 7 | 48 | 46 |
| Example 8 | 25 | 25 |
| Example 9 | 46 | 21 |

Figure 12A:
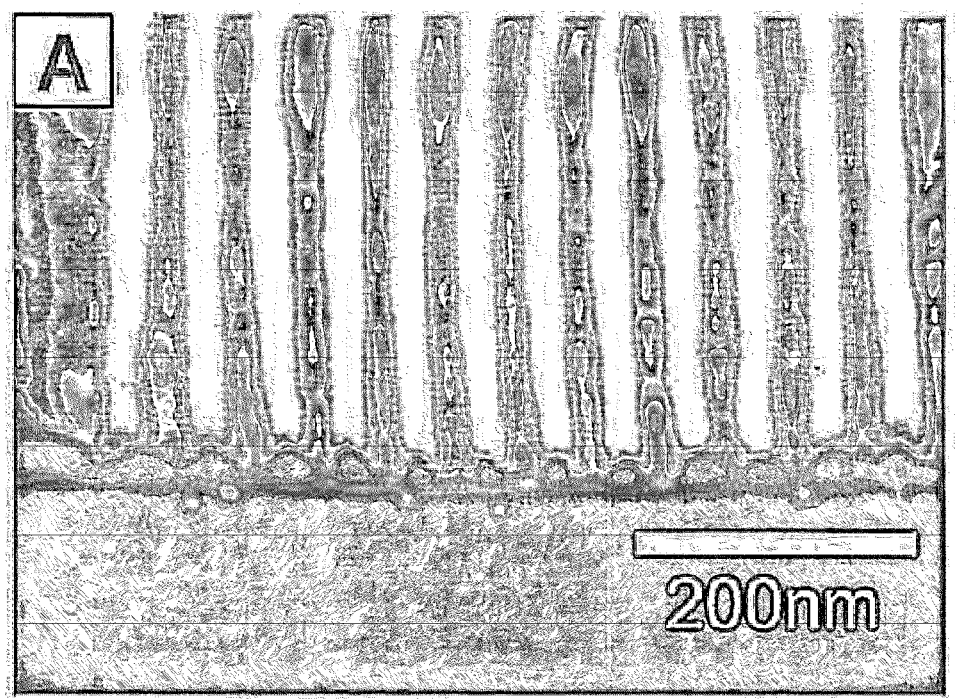
Figure 12B:
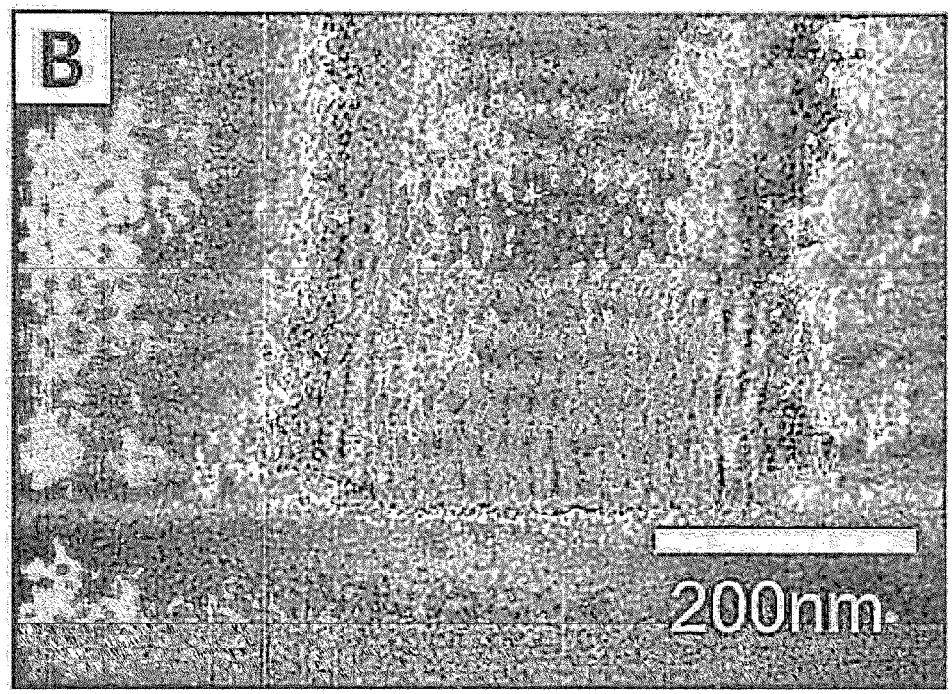
Figure 12C:
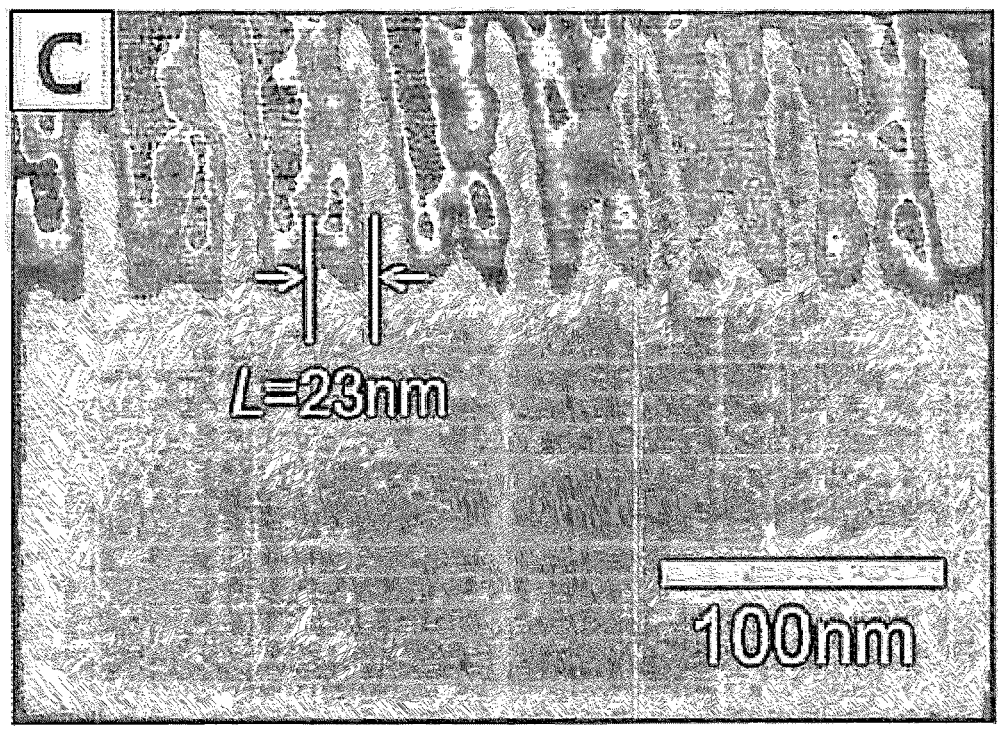
Figure 12D:
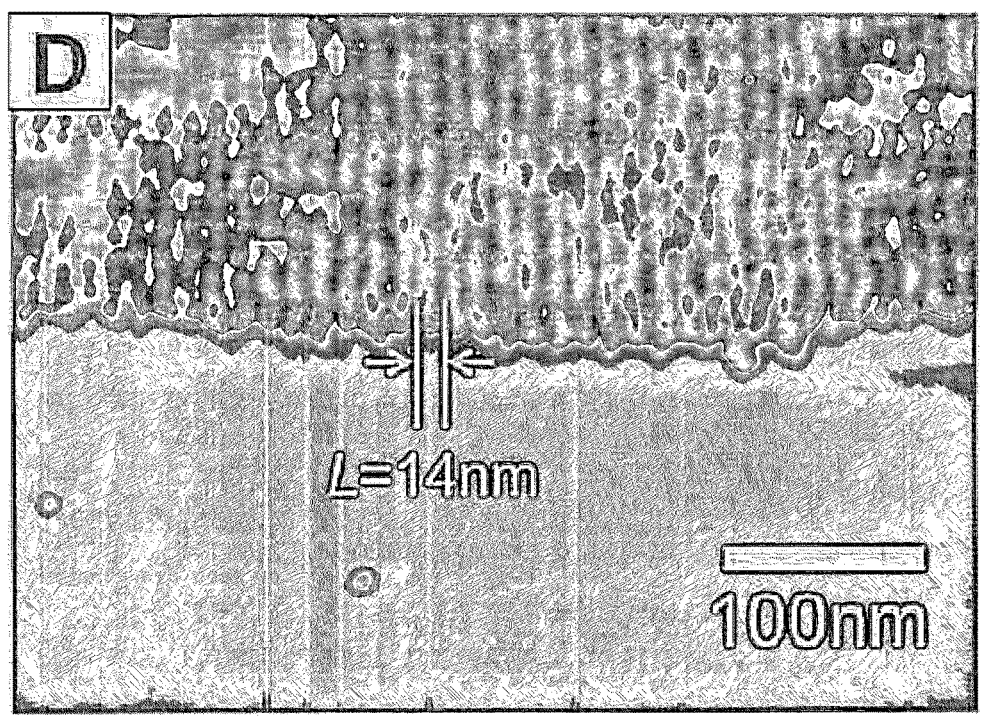

As shown in FIGS. 11 and 12, in Example 7 in which PS and PMMA had molecular weight of 48 kg/mol, and 46 kg/mol, respectively, the block copolymer had a cycle ($I_0$) of about 46 nm (FIG. 12A), and in Example 8, the block copolymer had a cycle of about 30 nm (FIG. 12B). In addition, the cycle (L) of the finally formed metal nanopatterns was 23 nm (Example 7, FIG. 12C), 14 nm (Example 8, FIG. 12D), such that it could be confirmed that the cycle of the metal nanopatterns could be controlled depending on the molecular weight of the block copolymer, and the cycle of the metal nanopatterns was precisely half the cycle of the block copolymer, and therefore, it could be appreciated that density of the aluminum oxide ($Al_2O_3$) nanopatterns was improved by twice as much in the same area. Further, it could be appreciated that the pitch length (d) of the formed metal nanopatterns was 5 nm, which was the same as the deposition thickness of the deposited inorganic spacer layer during the process.

Figure 13A:
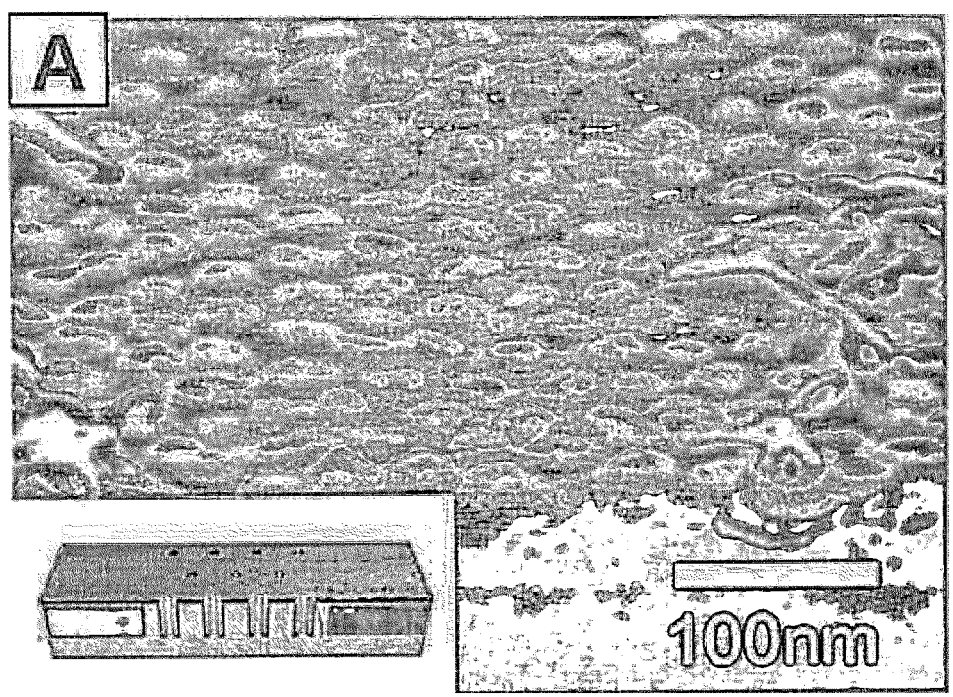
Figure 13B:
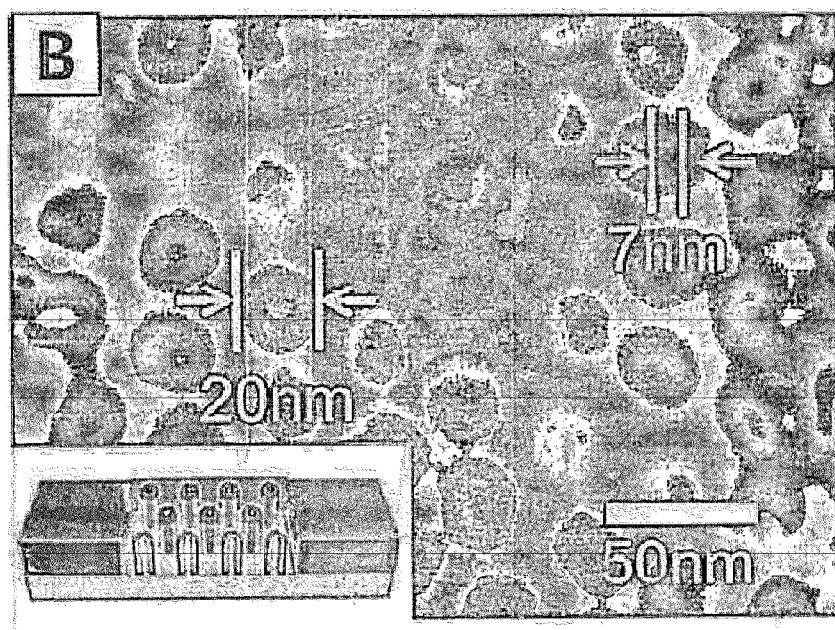
Figure 13C:
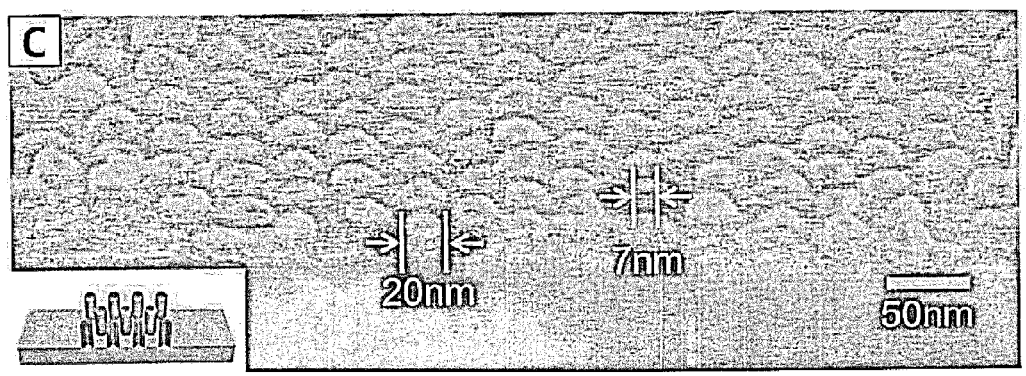

In addition, from Example 9 in which molecular weights of PS and PMMA were 46 kg/mol, and 21 kg/mol, respectively, it could be confirmed that cylinder shaped nanopatterns were formed by using asymmetric polystyrene-block-polymethacrylate, the cycle ($I_0$) of the block copolymer was about 40 nm, and the cylinder size was about 20 nm (FIG. 13B). Further, it could be confirmed that external diameter of the finally formed cylinder shaped metal nanopatterns was 20 nm, the pore size in the cylinder was 7 nm (FIG. 13C), and height of the cylinder was about 30 nm, such that predetermined shaped patterns were formed.

Examples 10 and 11

In order to appreciate that the aluminum oxide ($Al_2O_3$) nanopatterns formed by Examples 8 and 10 are usable as an etching mask, Si substrate was etched by ICP-RIE, wherein the etching conditions were $O_2$ (13 SCCM)/$C_4F_8$ (40 SCCM), RF power of 3,000, 75 W RF chuck power, 10 mTorr.

Figure 14A:
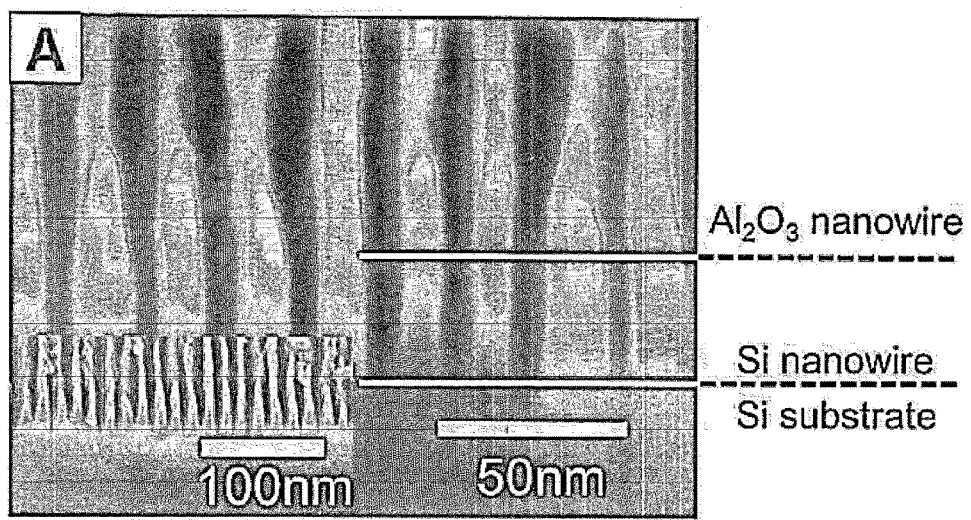
Figure 14B:
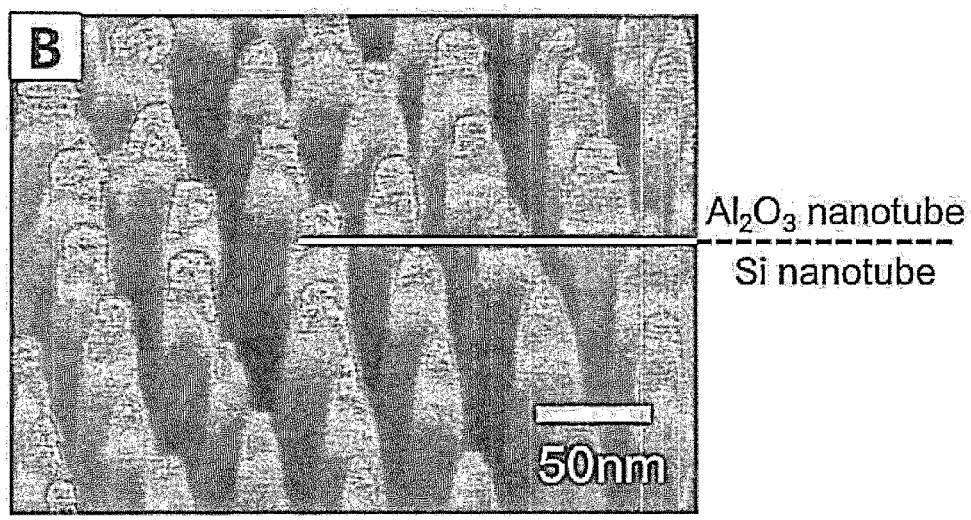

As a result of the etching process, silicon line patterns (FIG. 13A: Example 10, FIG. 13B: Example 11) having a cycle of 15 nm and a line width of 5 nm were successfully formed as shown in FIGS. 14A-B. In addition, as shown in FIGS. 14A-B, it could be confirmed that aluminum oxide ($Al_2O_3$) nanopatterns formed before etching the Si substrate were formed in a nanowire shape (See FIG. 14A, $Al_2O_3$ nanowire), wherein the silicon wire (See FIG. 14A, Si nanowire) was formed in the lower part thereof, such that the silicon (Si) substrate was effectively etched without damaging the aluminum oxide ($Al_2O_3$) nanopatterns to form the silicon line patterns. Further, it could be confirmed that in the cylinder shaped aluminum oxide ($Al_2O_3$) nanopatterns (See FIG. 14B), aluminum oxide nanotube ($Al_2O_3$ nanotube) and silicon nanotube (Si nanotube) were successfully formed.

With the nanoscale patterning method according to the present invention, nanoscale patterns having desirable shapes such as a lamella shape, a cylinder shape, and the like, may be formed by using a self-assembly property of the block copolymer, and low segment interaction caused in a structure of 10 nm or less which is a disadvantage of the block copolymer may be prevented.

In addition, even though single photolithography is used, pattern density may double as that of the existing nano patterns, and pitch and cycle of precise patterns of 5 nm or less may be formed and controlled.

Further, since the nanoscale pattern formed by the nanoscale patterning method of the present invention may have high etching resistance, the fine nanopatterns may be used as a mask, such that patterns of 5 nm or less may be easily transmitted to a lower substrate to thereby be largely utilized for electronic apparatuses required for high integration of circuits such as a semiconductor device, and the like.

The present invention has been described in detail based on particular features thereof, and it is obvious to those skilled in the art that these specific technologies are merely preferable embodiments and thus the scope of the present invention is not limited to the embodiments. Therefore, the substantial scope of the present invention is defined by the accompanying claims and equivalent thereof.

What is claimed is:

1. A nanoscale patterning method using self-assembly, comprising:
    a) a step of depositing an organic photoresist layer on a surface of a substrate to form the organic photoresist layer directly contacted with the substrate, and forming organic photoresist patterns on the substrate by using lithography;
    b) a step of forming a block copolymer thin film including two or more kinds of domain blocks on the substrate including the organic photoresist patterns formed thereon;
    c) a step of selectively removing any one domain block from the block copolymer thin film;
    d) a step of forming an inorganic spacer layer on a surface of the block copolymer thin film of the step c); and
    e) a step of removing the remaining block copolymer thin film of the step d) and the organic photoresist patterns,
    wherein the block copolymer is obtained by polymerizing at least one hydrophilic domain block and at least one hydrophobic domain block, and
    wherein when it is assumed that a molecular weight of the entire block copolymer is 100, a molecular weight ratio of each domain block is 20 to 80 (hydrophilic domain block):80 to 20 (hydrophobic domain block).

2. The nanoscale patterning method of claim 1, wherein the step b) includes:
    b1) a step of forming the block copolymer thin film on a region exposed through the photoresist patterns; and
    b2) a step of forming a self-assembled nanostructure in the region exposed through the photoresist patterns by annealing the block copolymer thin film.

3. The nanoscale patterning method of claim 1, wherein the step e) includes:
    e1) a step of removing a portion parallel to a first direction from the inorganic spacer layer; and
    e2) a step of removing the remaining block copolymer thin film.

4. The nanoscale patterning method of claim 1, wherein the step d) of forming the inorganic spacer layer is performed by any one or two or more methods selected from the group consisting of resistance heating vapor deposition, electron beam heating vapor deposition, high-frequency heating vapor deposition, laser beam heating vapor deposition, direct current (DC) sputtering, radio frequency (RF) sputtering, bias sputtering, ion plating, epitaxial, atmospheric pressure CVD, low pressure CVD, plasma CVD, photo CVD and atomic layer deposition (ALD).

5. The nanoscale patterning method of claim 1, wherein the organic photoresist includes any one or two or more polymer resins selected from the group consisting of novolac polymer, polyvinyl phenol, acrylate, norbornene polymer, polytetrafluoroethylene, silsesquioxane polymer, polymethylmethacrylate, terpolymer, poly-1-butene sulfone, novolak-based positive electron resist, poly(methyl-α-chloroacrylate-co-α-methyl styrene), poly(glycidyl methacrylate-co-ethyl acrylate) and polychloromethylstyrene.

6. The nanoscale patterning method of claim 1, wherein the lithography is any one or two or more selected from the group consisting of photolithography, soft lithography, nanoimprint lithography, and scanning probe lithography.

7. The nanoscale patterning method of claim 1, wherein the block copolymer is any one or two or more selected from the group consisting of polystyrene-block-polymethylmethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene.

8. The nanoscale patterning method of claim 1, further comprising:
    f) a step of etching a surface of the substrate of the step e), using the inorganic spacer layer as an etching mask.

* * * * *